United States Patent
Finch et al.

(10) Patent No.: US 9,128,131 B2
(45) Date of Patent: Sep. 8, 2015

(54) DEVICE FOR MEASURING TWO PHASE POWER WITH SINGLE VOLTAGE INPUT

(75) Inventors: Michael Francis Finch, Louisville, KY (US); Joshua Blake Huff, Louisville, KY (US)

(73) Assignee: General Electric Company, Schenectady, NY (US)

( * ) Notice: Subject to any disclaimer, the term of this patent is extended or adjusted under 35 U.S.C. 154(b) by 222 days.

(21) Appl. No.: 13/081,844

(22) Filed: Apr. 7, 2011

(65) Prior Publication Data

US 2012/0259566 A1 Oct. 11, 2012

(51) Int. Cl.
*G01R 21/06* (2006.01)
*G06F 19/00* (2011.01)
*G01R 21/133* (2006.01)

(52) U.S. Cl.
CPC ............ *G01R 21/06* (2013.01); *G01R 21/1331* (2013.01)

(58) Field of Classification Search
CPC ............................ G01R 21/00; G01R 19/2513
USPC .............................................. 702/60, 61, 62
See application file for complete search history.

(56) References Cited

U.S. PATENT DOCUMENTS

| | | | |
|---|---|---|---|
| 7,772,829 B2 * | 8/2010 | Shuey | 324/142 |
| 7,930,118 B2 * | 4/2011 | Vinden et al. | 702/64 |
| 8,335,062 B2 * | 12/2012 | Haines et al. | 361/42 |
| 8,355,826 B2 | 1/2013 | Watson et al. | |
| 2006/0049694 A1 * | 3/2006 | Kates | 307/132 E |
| 2010/0301837 A1 * | 12/2010 | Higuma et al. | 324/140 R |
| 2011/0006756 A1 | 1/2011 | Rosewell et al. | |
| 2012/0169300 A1 * | 7/2012 | Rouaud et al. | 323/207 |

* cited by examiner

*Primary Examiner* — Michael Nghiem
*Assistant Examiner* — Ivan Rabovianski
(74) *Attorney, Agent, or Firm* — Dority & Manning, P.A.

(57) ABSTRACT

A device and method for more accurately measuring power consumption in a residential application without having to make connections to high voltage sources in a distribution panel. Since the device calculating the power consumption generally needs to be powered to perform its functions (e.g., plugged into wall outlet), the disclosure utilizes the power supply as a voltage source for measuring voltage without having to make connections to the panel.

14 Claims, 2 Drawing Sheets

DEVICE FOR MEASURING TWO PHASE POWER WITH SINGLE VOLTAGE INPUT

BACKGROUND OF THE DISCLOSURE

The present disclosure relates to power consumption measurement and, more particularly, to power consumption measurement for residential application.

Multi-phase power consumption measurement has been done in industry and by utilities for many years. Typically 2-phase power consumption has been measured at the electricity meters on the sides of homes, and 3-phase power consumption in industry use measured by electricity meters or other devices installed at the industrial location.

The equation used to describe the measurement of power consumption is:

$$\text{Energy} \equiv \int \sum_i V_i \cdot I_i dt$$

where V and I are the voltage and current in each phase expressed as a vector.

There are many electrical circuits and electromechanical devices to make these measurements. Such devices generally take a voltage and a current input. Most recently, such devices typically take a voltage and current measurement for each phase and capture them many times a second and then multiply the instantaneous voltage by the instantaneous current. These values are then stored in a register and normalized to watt-seconds by dividing by the number of samples per second. Examples of existing devices that measure power consumption include the Teridian 78M6612-IGTR/F manufactured by Teridian Semiconductor Corp., or ST Microelectonics STPM Family.

In a residential application, however, such prior art approaches are problematic because they generally require two voltage references and two current measurements. Measuring current in a residential application is relatively straightforward and without significant risk. Conventionally, two clamp-on current transformers (CTs) are placed inside a residential power distribution panel and the low voltage leads brought out of the panel and connected to the power measurement device. This generally does not require making any electrical contacts in the box, and makes the installation of the CTs within the range of most handy-men.

To get two voltage references, however, two connections need to be made in the panel and high voltage leads brought out of the panel, requiring more care to comply with code and safety regulations. Thus, rather than measure voltage, many prior art devices simply assume a voltage (such as 120 volts for a residential application). This results in less accurate measurements since in many instances the actual voltage will not equal the assumed value.

SUMMARY OF THE DISCLOSURE

The present disclosure provides a device and method for more accurately measuring power consumption in a residential application without having to make connections to high voltage sources in a distribution panel. Since the device calculating the power consumption generally needs to be powered to perform its functions (e.g., plugged into a wall outlet), the disclosure utilizes the voltage at the outlet for measuring voltage without having to make connections to the panel. In accordance with one aspect, a device for measuring power consumption of a household having a conventional 120/240 volt AC power source provided by an electric utility company comprising power lines L1, L2 and N and one or more power outlets coupled to the source for supplying power to energy consuming appliances, is connectable to a power outlet and comprises a metering microcontroller unit having a voltage input for measuring the voltage at the outlet and first and second current inputs for measuring current flowing into the household via lines L1 and L2. The metering microcontroller is configured to calculate power consumption based on the voltage received from the outlet and the two separate current values provided thereto.

The current values can be provided to the metering microcontroller unit via first and second current transformers connected to respective lines supplying power to the household. A communication interface can be provided for communicating data relating to power consumption. The communication interface can include a wireless communication interface for communication power consumption information to a remote device. A display for displaying power consumption information to a user can be provided. The device can further comprise a first current transformer connectable to a first line supplying power to the household and a second current transformer connectable to a second line supplying power to the household, the first and second current transformers connected to respective inputs of the metering microcontroller unit. The power supply can include a conventional plug adapted for receipt in a 110 volt outlet.

In accordance with another aspect, a system for measuring power consumption of a household comprises a main power distribution panel for receiving first and second power lines and distributing power to at least one household load, an outlet connected to the main power distribution panel for receiving power therefrom, a device for measuring power consumption of a household as set above, a power supply of the device being connected to the outlet, and first and second current transformers each associated with a respective power line for providing a current value to the respective first and second inputs of the device for measuring power consumption.

In accordance with another aspect, a device for measuring power consumption of a household comprises a power supply connectable to a household outlet for receiving power therefrom, and a microprocessor connected to the power supply and configured to i) receive a first current value corresponding to a current in a first line supplying power to the household, ii) receive a second current value corresponding to a current in a second line supplying power to the household; iii) detect a voltage value of the power received by the power supply, and iv) calculate power consumption by integrating with respect to time the sum of the voltage value multiplied by the first current value and the negative of the voltage value multiplied by the second current input. The device can further include user interface for enabling a user to input and output data.

In accordance with another aspect, a method of measuring power consumption of a two-phase power distribution system having a distribution panel, the method comprises measuring a first current value associated with a first power line supplying power to the distribution panel, measuring a second current value associated with a second power line supplying power to the distribution panel, measuring a voltage value of either the first or second power line via an outlet connected to said first or second line via the distribution panel, and calculating power consumption based on the first current, the second current and the single voltage value. The calculating can include taking an integral with respect to time of the sum of the products of the voltage value and the first current value and the product of the negative of the voltage value and the second current value. The method can further include communicating information related to power consumption to a remote device via a communication interface.

DETAILED DESCRIPTION OF THE PREFERRED EMBODIMENTS

Figure 1:
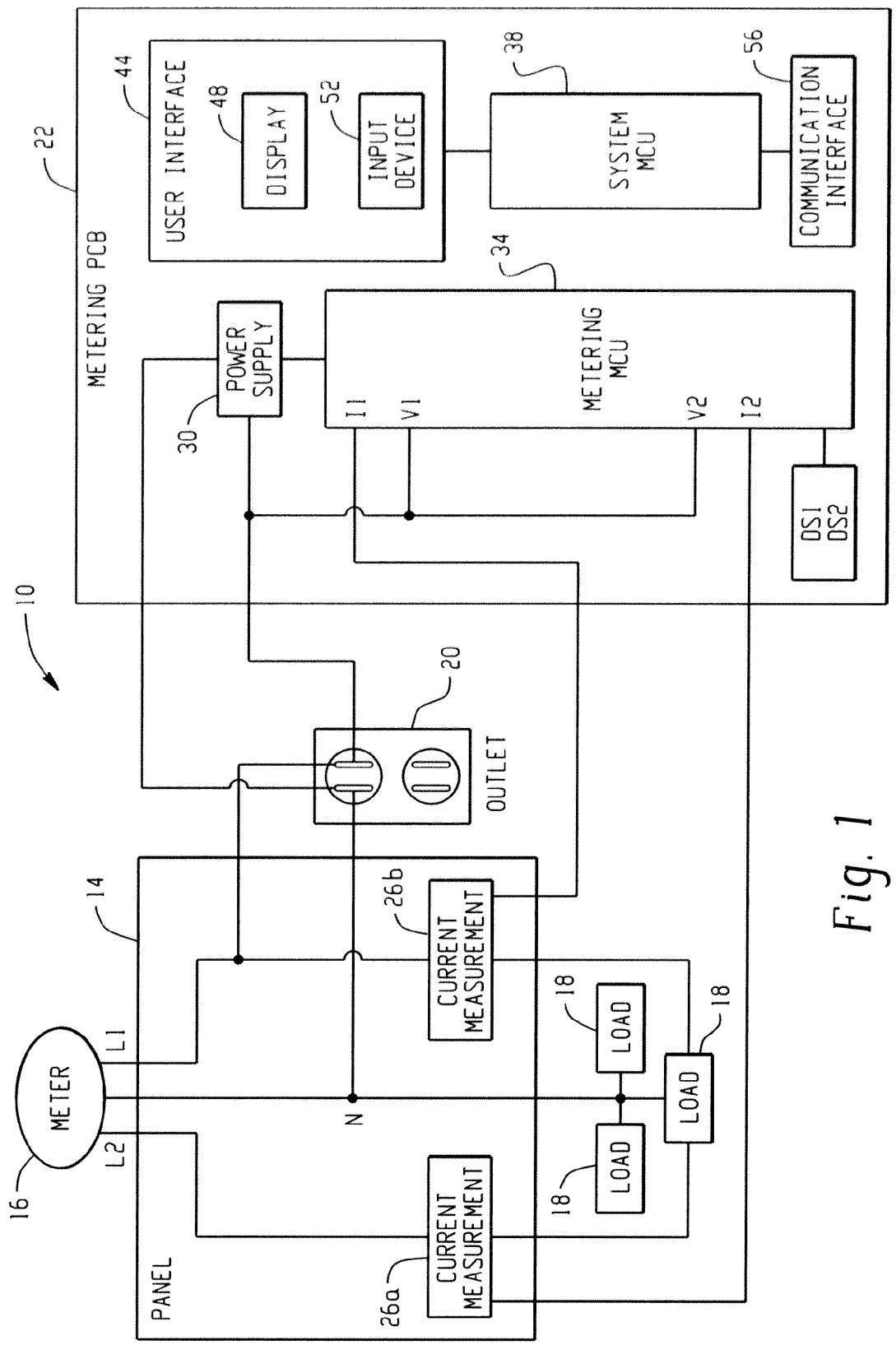
FIG. 1 is a block diagram of an exemplary device and system for measuring power consumption in accordance with the present disclosure.

Turning to the drawing, an exemplary system 10 in accordance with the present disclosure is illustrated. The system 10 includes a main power distribution panel 14 for receiving power from first and second power lines L1 and L2 and neutral line N coming from a utility company via meter 16 in conventional domestic arrangement. The distribution panel 14 distributes the power to one or more 120 volt household loads 18, via L1 and N or L2 and N including an outlet 20 served by L1 and N. Household loads requiring 240 volt supply receive power via L1 and L2. A power consumption measurement device 22 (also referred to herein as a metering device) is connected to the outlet 20. A pair of current transformers 26a and 26b are each associated with a respective power line L1 and L2 for providing a current measurement in the form of a voltage signal proportional to the current flowing in L1 and L2 respectively to respective first and second current inputs I1 and I2 of the power consumption measurement device 22.

The exemplary power consumption measurement device 22 includes a power supply connected to the outlet 20 for receiving power therefrom. Device 22 includes a metering microcontroller unit 34 programmed to calculate whole home power consumption. Microcontroller unit 34 has a pair of voltage inputs V1 and V2 for receiving a voltage value for V1 measured across L1 and N which is the signal supplied to outlet 20 and a second voltage value V2 which would conventionally be measured across L2 and N. However, in the device 22, advantageous use is made of the relationship of V1 measured across L1 and N, and V2 measured across L2 and N, namely V1 equals −V2. So, rather than requiring a connection to L2, the voltage V1 from outlet 20 is applied to both voltage inputs V1 and V2 and the microcontroller is programmed to change the sign of the signal received at V2. A system controller 38 is connected to the metering microcontroller unit 34. A user interface 44, which can include a display 48 and/or a user input device 52, is provided for interfacing with a user of the device.

The metering microcontroller unit 34 is configured to calculate power consumption based on the voltage of the power signal received at outlet 20, and two separate current values provided thereto from the current transformers 26a and 26b. This obviates the need to bring high voltage leads out of the distribution panel and, thus, makes installation of the device 22 safer and within the skills of most handy-men.

To calculate power consumption in a two-phase power system (such as a residential power system, the equation noted in the background above simplifies to:

$$\text{Energy} = \int V_1 \cdot I_1 + V_2 \cdot I_2 \, dt$$

Since most residential home power installations in the US are 120V/240V, the V2 is the above equation equals −V1. This means that the integral above can be further simplified to:

$$\text{Energy} = \int V_1 \cdot I_1 - V_1 \cdot I_2 \, dt$$

Thus, it will be appreciated that the single voltage source (e.g., the outlet 20) can be used by the power consumption measurement device 22 to calculate the whole power consumption.

Once the power consumption is calculated, data relating to the power consumption can be communicated to a user via the user interface 44. For example, the power consumption information, such as kilowatt hours consumed, can be displayed on the display 48. The user interface 44 could also be configured to display a colored indicator based on instantaneous power consumption. For example, a green indicator could be displayed when power consumption is below a certain threshold value, while a red indicator could be displayed when power consumption is above a certain threshold value.

The power consumption device 22 can further include a communication interface 56 for communicating with other devices. For example, the power consumption measurement device could be connected to the internet for transmitting and/or receiving data relating to power consumption to a remote device or service, such as a server at a power company. The power consumption measurement device could also be adapted to communicate with a home energy management device of a home energy management (HEM) system. An exemplary HEM system is described in commonly-assigned U.S. patent application Ser. No. 12/559,636 filed on Sep. 15, 2009, which is hereby incorporated by reference herein in its entirety.

Figure 2:
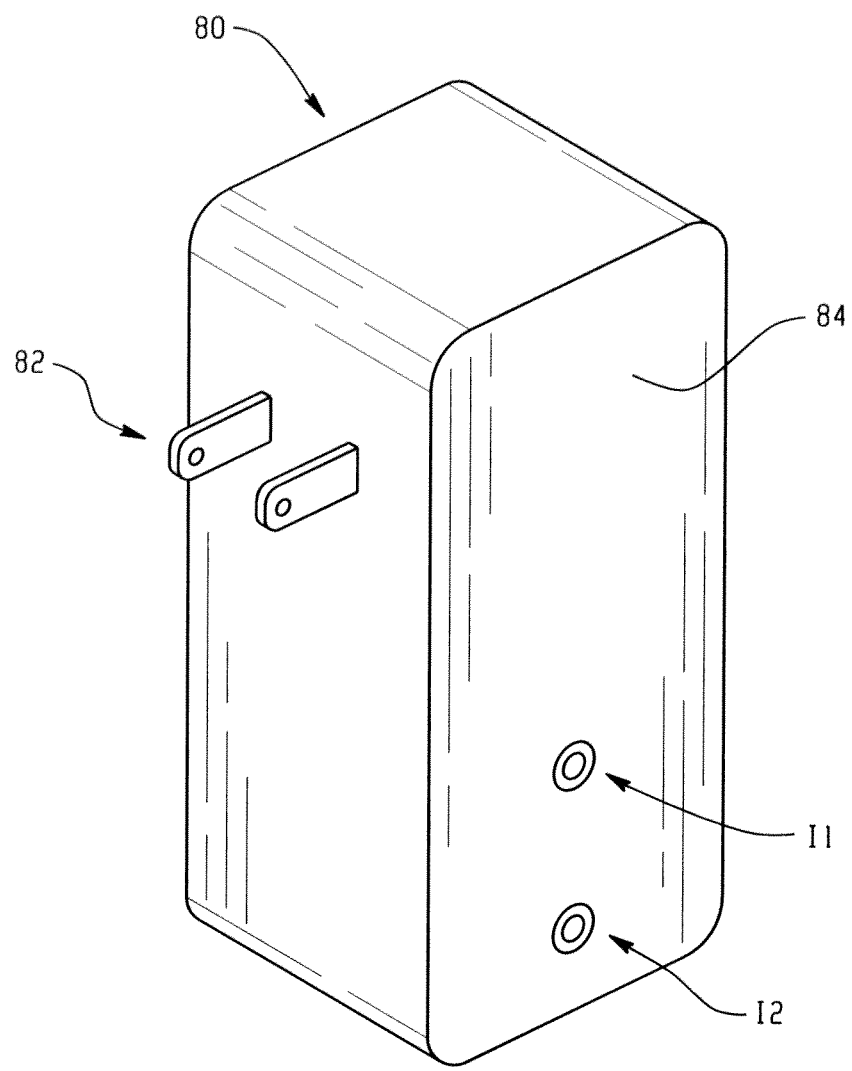
FIG. 2 is an exemplary device for measuring power consumption in accordance with the present disclosure.

Turning now to FIG. 2, an exemplary physical embodiment of the metering device is illustrated in the form of a wall mountable unit 80 including a standard two prong plug 82 adapted to be received in a conventional outlet. The wall mountable unit 80 takes the shape of a "wall wart" that is can be plugged into a wall outlet which supports the unit 80 as well as provides power thereto. Of course, the metering device can come in a wide variety of form factors, and the wall wart embodiment in merely exemplary.

The unit 80 includes a housing 84 in which the components of FIG. 1 such as the power supply 30, metering microcontroller unit 34, system controller 38, communication interface, etc., may be housed. First and second current input ports I1 and I2 are provided for connection to current transformers or the like for receiving a current reading. Although not shown in FIG. 2, the unit 80 can include a user interface having one or more LEDs, a display, buttons etc. for enabling a user to interface with the unit 80. Alternatively, the user interface may be remote from the unit 80 and utilize a communication interface integral with the unit 80 for connecting the unit 80 to the remote interface. For example, a home computer or cell phone or other device having a user interface could be adapted to communicate with the unit 80 for operation thereof.

It will now be appreciated that the present disclosure provides a power consumption measurement device that can be easily installed, and receives a voltage measurement from a standard outlet resulting in a more accurate measurement. By placing the outlet near the distribution panel, the device can be installed easily by most handy-men.

The invention has been described with reference to the preferred embodiments. Obviously, modifications and alterations will occur to others upon reading and understanding the preceding detailed description. It is intended that the invention be construed as including all such modifications and alterations.

What is claimed is:

1. A device for measuring a power consumption of a building receiving power from a conventional 120/240 volt AC power source comprising a first power line, a second power line and a neutral line, and at least one single-phase power outlet configured to receive a voltage and coupled to the first power line of the 120/240 volt AC power source, the device configured for operable connection to the at least one single-phase power outlet, the device comprising:
   a metering microcontroller unit comprising:
      a voltage input terminal configured to operably receive the voltage of the first power line from one of the at least one single-phase power outlet, wherein the metering microcontroller unit is configured to measure a first voltage value from the received voltage; and
      a first current input terminal and a second current input terminal configured to respectively receive a first current signal and a second current signal, the first current signal and the second current signal being indicative of an amount of current flowing in the first power line and the second power line respectively, wherein the metering microcontroller unit is further configured to calculate a second voltage value based on the measured first voltage value, the second voltage value being indicative of the voltage of the second power line, and to calculate the power consumption of the building based on the measured first voltage value, the calculated second voltage value, and the first and the second current signals.

2. The device as set forth in claim 1, wherein first and the second current signals are provided to the metering microcontroller unit via a first and a second current transformers connected to a respective power line of the first and the second power lines.

3. The device as set forth in claim 1, further comprising a communication interface for communicating data relating to the power consumption.

4. The device as set forth in claim 3, wherein the communication interface comprises a wireless communication interface for communicating power consumption information to a remote device.

5. The device as set forth in claim 1, further comprising a display for displaying power consumption information to a user.

6. The device as set forth in claim 1, further comprising a first current transformer connectable to the first power line and a second current transformer connectable to the second power line, the first and second current transformers connected to a respective current input terminal of the first and the second current input terminals of the metering microcontroller unit.

7. The device as set forth in claim 1, further comprising a power supply, wherein the power supply and the metering microcontroller unit are housed within a housing of a two prong plug comprising two electrically conductive prongs configured to plug into one of the at least one single-phase power outlet, the power supply connectable to the single-phase power outlet via the electrically conducting prongs.

8. A system for measuring a power consumption of a-building, the system comprising:
   a main power distribution panel for receiving a first power line and a second power line and distributing power to at least one household load;
   at least one single phase power outlet configured to receive a voltage and coupled to the first power line through the main power distribution panel;
   a device for measuring the power consumption of the building, wherein the device comprises a metering microcontroller unit comprising:
      a voltage input terminal arranged to operably receive the voltage of the first power line from one of the at least one single-phase power outlet, wherein the metering microcontroller unit is configured to measure a first voltage value from the received voltage; and
      a first current input terminal and a second current input terminal configured to respectively receive a first current signal and a second current signal, the first current signal and the second current signal being indicative of an amount of current flowing in the first power line and the second power line respectively,
      wherein the metering microcontroller unit is further configured to calculate a second voltage value based on the measured first voltage value, the second voltage value being indicative of the voltage of the second power line, and to calculate the power consumption of the building based on the measured first voltage value, the calculated second voltage value, and the first and the second current signals; and
   a first current transformer and a second current transformer each associated with a respective power line of the first and the second power lines for providing the first and the second current signals to the respective current input terminal of the first and the second current input terminals of the device for measuring the power consumption.

9. A device for measuring a power consumption of a-building, the device comprising:
   a power supply including a first power supply line and a second power supply line, the first power supply line connectable to at least one single-phase power outlet configured to receive a voltage therefrom; and
   a microprocessor connected to the power supply and configured to:
      receive a first current signal indicative of an amount of current flowing in the first power line supplying power to the building,
      receive a second current signal indicative of the amount of current in the second power line supplying power to the building,
      measure a first voltage value from the received voltage;
      calculate a second voltage value as the negative of the measured first voltage value, the second voltage value being indicative of the voltage of the second power supply line; and
      derive the power consumption of the building by integrating with respect to time the sum of the measured first voltage value multiplied by the amount of current flowing in the first power line and the calculated second voltage value multiplied by the amount of current flowing in the second power line.

10. The device as set forth in claim 9, further comprising a user interface.

11. The device as set forth in claim 9, wherein the power supply and the microprocessor are housed within a housing of two prong plug comprising two electrically conductive prongs configured to plug into one of the at least one single-phase power outlet, the power supply connectable to the single-phase power outlet via the electrically conducting prongs.

12. A method of measuring a power consumption of a two-phase power distribution system having a distribution panel, the method comprising:
- measuring a first current value indicative of the amount of current flowing in a first power line supplying power to the distribution panel;
- measuring a second current value indicative of the amount of current flowing in a second power line supplying power to the distribution panel;
- measuring a voltage first value of either the first or the second power line via a single-phase power outlet configured to receive a single voltage and coupled to the first or the second power lines via the distribution panel;
- calculating a second voltage value based on the measured first voltage value, the second voltage value being indicative of the voltage of the first or the second power lines not coupled to the single-phase power outlet; and
- calculating the power consumption of the building based on the first current value, the second current value, the measured first voltage value, and the calculated second voltage value.

13. The method as set forth in claim 12, wherein calculating the power consumption of the building comprises taking an integral with respect to time of the sum of the products of the measured first voltage value and the first current value and the product of the calculated second voltage value and the second current value.

14. The method as set forth in claim 13, further comprising communicating information related to the power consumption to a remote device via a communication interface.

* * * * *